(12) United States Patent  (10) Patent No.: US 7,796,721 B2
Fattaruso                  (45) Date of Patent:     Sep. 14, 2010

(54) HIGH SPEED, SYMMETRICAL PRESCALER

(75) Inventor: John William Fattaruso, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 72 days.

(21) Appl. No.: 12/261,854

(22) Filed: Oct. 30, 2008

(65) Prior Publication Data

US 2010/0111244 A1    May 6, 2010

(51) Int. Cl.
    *H03K 21/00* (2006.01)
(52) U.S. Cl. .......................... 377/47; 377/48
(58) Field of Classification Search ............... None
    See application file for complete search history.

(56) References Cited

U.S. PATENT DOCUMENTS

| | | | |
|---|---|---|---|
| 3,439,278 A | 4/1969 | Farrow | |
| 3,530,284 A | 9/1970 | Wood | |
| 3,943,379 A | 3/1976 | McGuffin | |
| 4,348,640 A | 9/1982 | Clendening | |
| 4,366,394 A | 12/1982 | Clendening et al. | |
| 4,656,649 A * | 4/1987 | Takahashi | 377/48 |
| 4,703,495 A | 10/1987 | Bereznak | |
| 5,172,400 A * | 12/1992 | Maemura | 377/116 |
| 5,867,068 A | 2/1999 | Keating | |
| 6,313,673 B1 * | 11/2001 | Watanabe | 327/115 |
| 6,389,095 B1 | 5/2002 | Sun | |
| 6,459,310 B1 * | 10/2002 | Thomson et al. | 327/115 |
| 6,522,711 B2 * | 2/2003 | Wakada et al. | 377/48 |
| 6,882,229 B1 * | 4/2005 | Ho et al. | 331/1 A |
| 7,119,587 B2 | 10/2006 | Boerstler et al. | |
| 7,579,883 B2 * | 8/2009 | Dekate et al. | 327/117 |
| 2002/0114422 A1 | 8/2002 | Ishiwaki | |
| 2008/0186062 A1 | 8/2008 | Dekate et al. | |

* cited by examiner

*Primary Examiner*—Tuan Lam
(74) *Attorney, Agent, or Firm*—John J. Patti; Wade J. Brady, III; Frederick J. Telecky, Jr.

(57) ABSTRACT

Over the years, ring counter and prescalers have been used in a variety of microelectronic applications, including Phased Locked Loops or PLLs. All of these applications have experienced both decreases in size and increases in speed. As a result, current-mode logic or CML has come into use in some high speed applications, calling for alternative designs for components such as prescalers. Here, a divide-by-three prescaler is described that uses internal states from mater-slave flip-flop pairs and that is well-suited for microelectronics that employ CML.

16 Claims, 4 Drawing Sheets

HIGH SPEED, SYMMETRICAL PRESCALER

TECHNICAL FIELD

The invention relates generally to a prescaler or divider and, more particularly, to a divide-by-three current-mode logic (CML) prescaler.

BACKGROUND

Today, prescalers are commonly used in phased locked loop (PLL) structures. Typically, prescalers with a variety of frequency divisions and an approximate 50% duty cycle are employed. Most designs for these prescalers are relatively straightforward. Some examples of these designs are U.S. Pat. Nos. 3,530,284; 4,703,495; 5,867,068; and 7,119,587 and U.S. Patent Pre-Grant Pub. Nos. 2002/0114422 and 2008/0186062.

However, divide-by-three prescalers are of interest. Turning to FIG. 1, the desired clock signal for a divide-by-three prescaler can be seen. The input clock signal $CLK_{IN}$ would correspond to an output signal from a voltage controlled oscillator (VCO) into a prescaler, and the output clock signal $CLK_{OUT}$ would correspond to input clock signal $CLK_{IN}$ divided by three. As can be seen in FIG. 1, the output clock signal $CLK_{OUT}$ has a 50% duty cycle with symmetrical rise and fall times.

Over the years, there have been numerous designs for divide-by-three prescalers with a 50% duty cycle. Some examples are U.S. Pat. Nos. 3,439,278; 3,943,379; 3,902,125; 4,348,640; 4,366,394; and 6,389,095. Many of these designs, though, are not particularly applicable to CML, which uses synthesized frequencies above 1 GHz.

Therefore, there is a need for a divide-by-three prescaler that is compatible and applicable to CML.

SUMMARY

A preferred embodiment of the present invention, accordingly, provides an apparatus. The apparatus comprises a ring counter having a plurality of master-slave flip-flops arranged in a series, wherein each master-slave flip-flop receives a clock signal, and wherein the ring counter has an even integer multiple of N states; correction logic interposed in the series, wherein the correction logic gates outputs from at least some of the plurality of master-slave flip-flops, and wherein at least one of the master-slave flip-flops receives an output from the correction logic; and an output logic gate that gates an internal state from at least one of the master-slave flip-flops with an output from one of the master-slave flip-flops to produce the clock signal divided by N.

In accordance with a preferred embodiment of the present invention, the series further comprises a first master-slave flip-flop sequence and a second master-slave flip-flop sequence.

In accordance with a preferred embodiment of the present invention, the correction logic further comprises a first logic gate that gates outputs from the last master-slave flip-flop of the second sequence and at least one master-slave flip-flop in the first sequence; and a second logic gate that gates outputs from the first logic gate and the last master-slave flip-flop of the first sequence, wherein the first master-slave flip-flop of the second sequence receives an output from the second logic gate.

In accordance with a preferred embodiment of the present invention, the first logic gate is a NAND gate.

In accordance with a preferred embodiment of the present invention, the second logic gate is an AND gate.

In accordance with a preferred embodiment of the present invention, the output logic gate is a XOR gate.

In accordance with a preferred embodiment of the present invention, an apparatus is provided. The apparatus comprises a plurality of master-slave flip-flops arranged in a first sequence and a second sequence, wherein the plurality of master-slave flip-flops has an even integer multiple of N states, and wherein each master-slave flip-flop has a plurality of clocked latches; correction logic interposed between the first and second sequences, wherein the correction logic gates outputs from at least some of the plurality of master-slave flip-flops, and wherein at least one of the master-slave flip-flops from the plurality of master-slave flip-flops receives an output from the correction logic; and an output logic gate that gates an output from an internal clocked latch from at least one of the master-slave flip-flops with an output from one of the master-slave flip-flops to produce the clock signal divided by N.

In accordance with a preferred embodiment of the present invention, each master-slave flip-flop further comprises a first clocked latch that receives a clock signal at its clock input and a clockbar signal at its clockbar input; and a second clocked latch that receives the output of the first clocked latch, the clockbar signal at its clock input, and the clock signal at its clockbar input.

In accordance with a preferred embodiment of the present invention, the outputs of two clocked latches from the first sequence are gated by the output logic gate.

In accordance with a preferred embodiment of the present invention, the outputs of one clocked latch from the first sequence and one clocked latch from the second sequence are gated by the output logic gate.

In accordance with a preferred embodiment of the present invention, the correction logic further comprises a first logic gate that gates outputs from the last master-slave flip-flop of the second sequence and at least one master-slave flip-flop in the first sequence; and a second logic gate that gates outputs from the first logic gate and the last master-slave flip-flop of the first sequence, wherein the first master-slave flip-flop of the second sequence receives an output from the second logic gate.

In accordance with another preferred embodiment of the present invention, an apparatus is provided. The apparatus comprises a ring counter having 12 states and that receives a clock signal, wherein the ring counter includes: a first set of master-slave flip-flops arranged in a first sequence; and a second set of master-slave flip-flops arranged in a second sequence. The apparatus also includes a NAND gate that gates the outputs of the second set of master-slave flip-flops and at least one master-slave flip-flop from the first set of master-slave flip-flops; an AND gate that gates the outputs of the last master-slave flip-flop from the first sequence and the NAND gate, wherein the first master-slave flip-flop from the second sequence receives an output from the AND gate; and an XOR gate that gates the outputs from at least two clocked latches from the ring counter to output the clock signal divided by 3.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
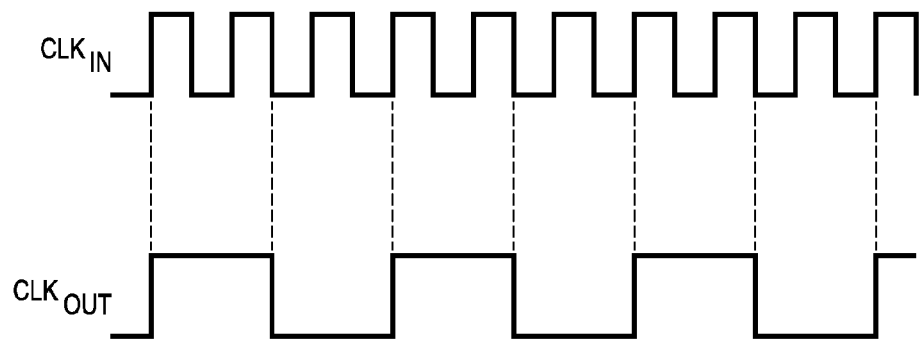
FIG. 1 is a timing diagram depicting a desired divide-by-three clock signal.

Refer now to the drawings wherein depicted elements are, for the sake of clarity, not necessarily shown to scale and wherein like or similar elements are designated by the same reference numeral through the several views.

Figure 2:
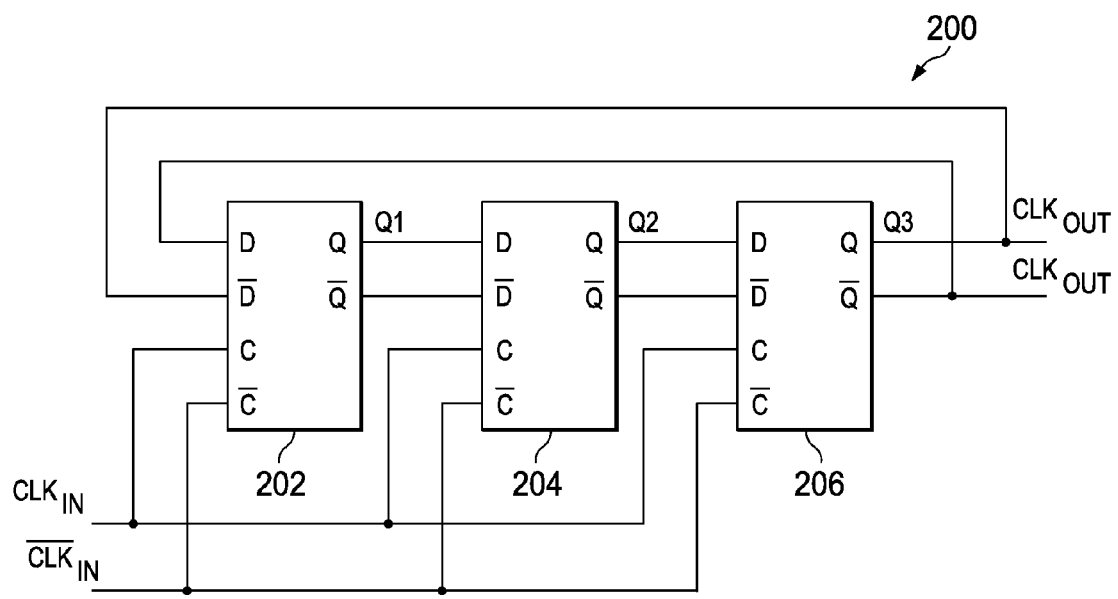
FIG. 2 is a CML ring counter.

Turning first to FIG. 2 of the drawings, a CML ring counter 200 is shown. As can be seen, ring counter 200 is comprised of three cascaded CML D-type master-slave flip-flops 202, 204, and 206. This ring counter 200 could serve as a symmetrical divide-by-six prescaler, but if the desired initialization conditions are not present, undesired states could exist, which could lead to instability of a PLL. In particular, the desired initial stated for ring counter 200 would have outputs Q1, Q2, and Q3 of flip-flops 202, 204 and 206 start at logic low or 0. The desired cycle for ring counter 200 would, then be as follows:

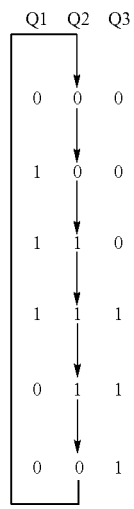

Ring counter 200, though, may be subject to undesired cycles as well. One example of an undesired cycle is as follows:

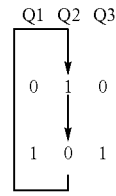

Accordingly, this undesired cycle would not produce an output clock signal that would generally correspond to the output clock signal $CLK_{OUT}$ of FIG. 1.

One simple solution to help ensure that ring counter 200 performs a desired cycle is to perform an initialization in a desired state, namely, where Q1, Q2, and Q3 are 0. However, this particular solution is also subject to entering into undesired cycles. In particular, disturbances by noise pulses on the supply lines or other spurious events may cause the ring counter 200 to enter an undesired state.

Another solution is to employ a small amount of logic in the design of a prescaler that would help to preclude the survival of any undesired cycle. Now turning to FIGS. 3-5, a prescalers 300, 400, and 500 in accordance with a preferred embodiment of the present invention can be seen.

Each of the prescalers 300, 400, and 500 has a ring counter 326, which is comprised of a series of master-slave flip-flops 302, 304, and 306. Each of these master-slave flip-flops 302, 304, and 306 typically comprise CML, D-type clocked latches 314/316, 318/320, and 322/324, where the master or internal clocked latches 314, 318, and 322 receive an input clock signal $CLK_{in}$ at their respective clock inputs and the slave clocked latches 316, 320, and 324 receive an input clock signal bar signal/$CLK_{in}$/at their respective clock inputs. Preferably, the ring counter 326 is subdivided into a first sequence (which includes master-slave flip-flops 302 and 304) and a second sequence (which includes master-slave flip-flop 306).

Interposed in the series of master-slave flip-flops 302, 304, and 306 is the correction logic 328. Preferably, the correction logic 328 is interposed between the first sequence 302 and 304 and the second sequence 306. The correction logic 328 is generally comprised of a first logic gate or CML NAND gate 308 and a second logic gate or CML AND gate 310. Preferably, in operation, the output of the last flip-flop of the second sequence (which is the output QS3 of slave latch 324), and the output of the first flip-flop 302 (output QS1 of slave latch 316) are gated by NAND 308. Additionally, output of NAND 308 and the last flip-flop of the first sequence (output QS2 of slave latch 320) are gated by AND 310. The output of AND 310 can then be input into the first flip-flop of the second sequence (DM of master latch 322). In this configuration, the NAND 308 sense when the two outer master-slave flip-flops 302 and 306 are both 0, while the AND 310 sets the input DM of master latch 322 to 0 if that state is detected.

Figure 3:
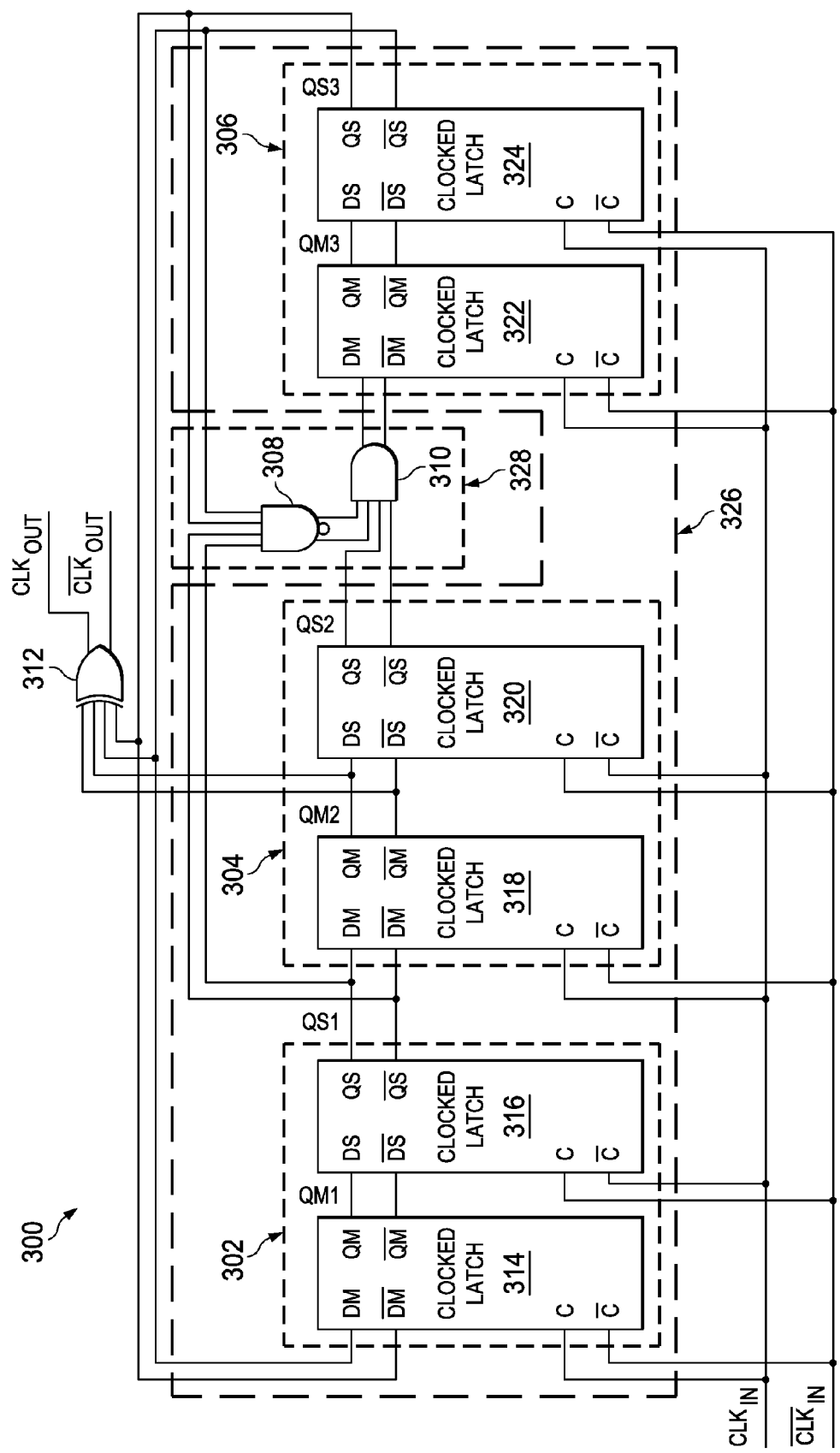
FIG. 3 is a first divide-by-three CML prescaler in accordance with a preferred embodiment of the present invention.
Figure 4:
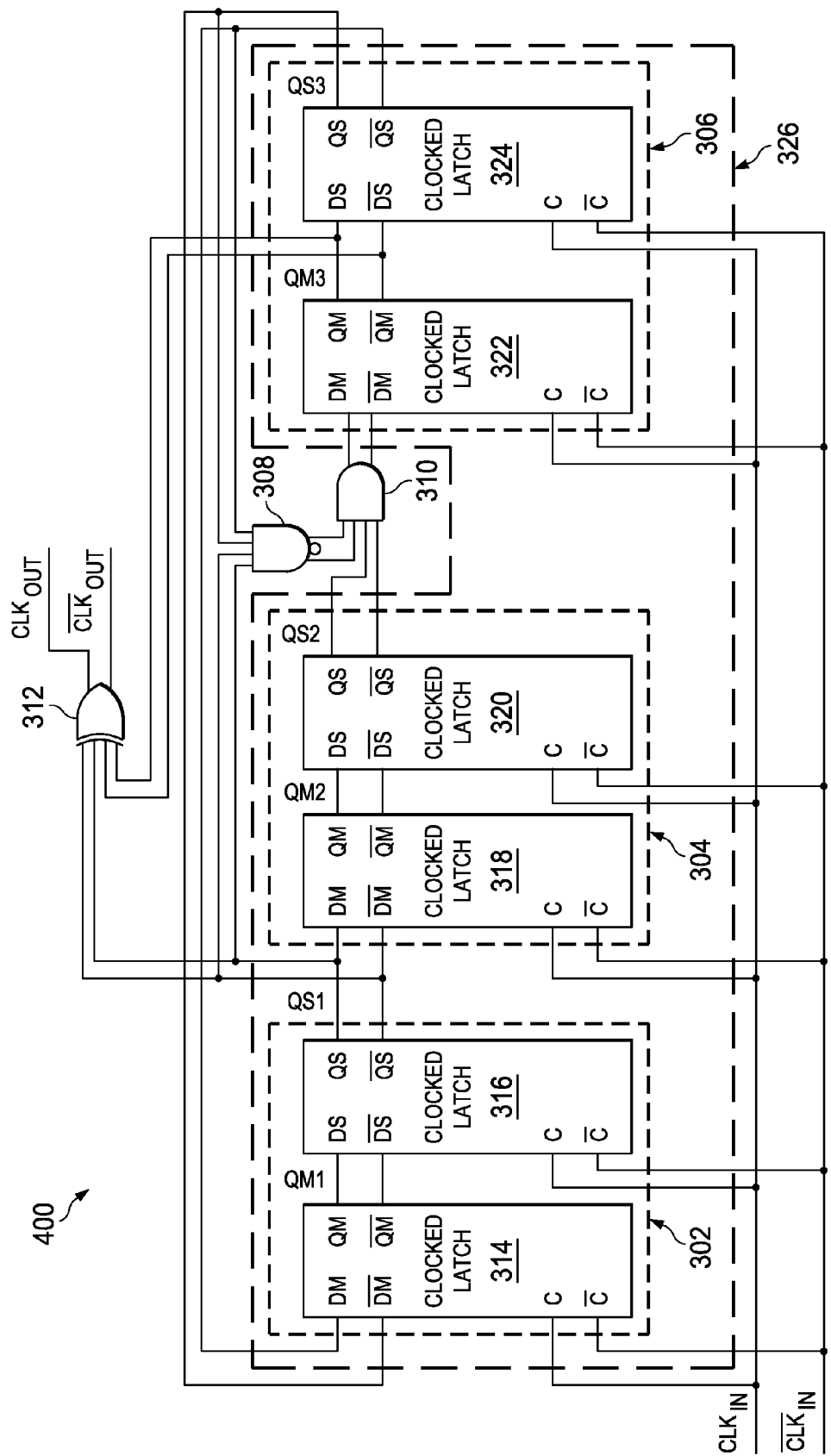
FIG. 4 is a second divide-by-three CML prescaler in accordance with a preferred embodiment of the present invention.
Figure 5:
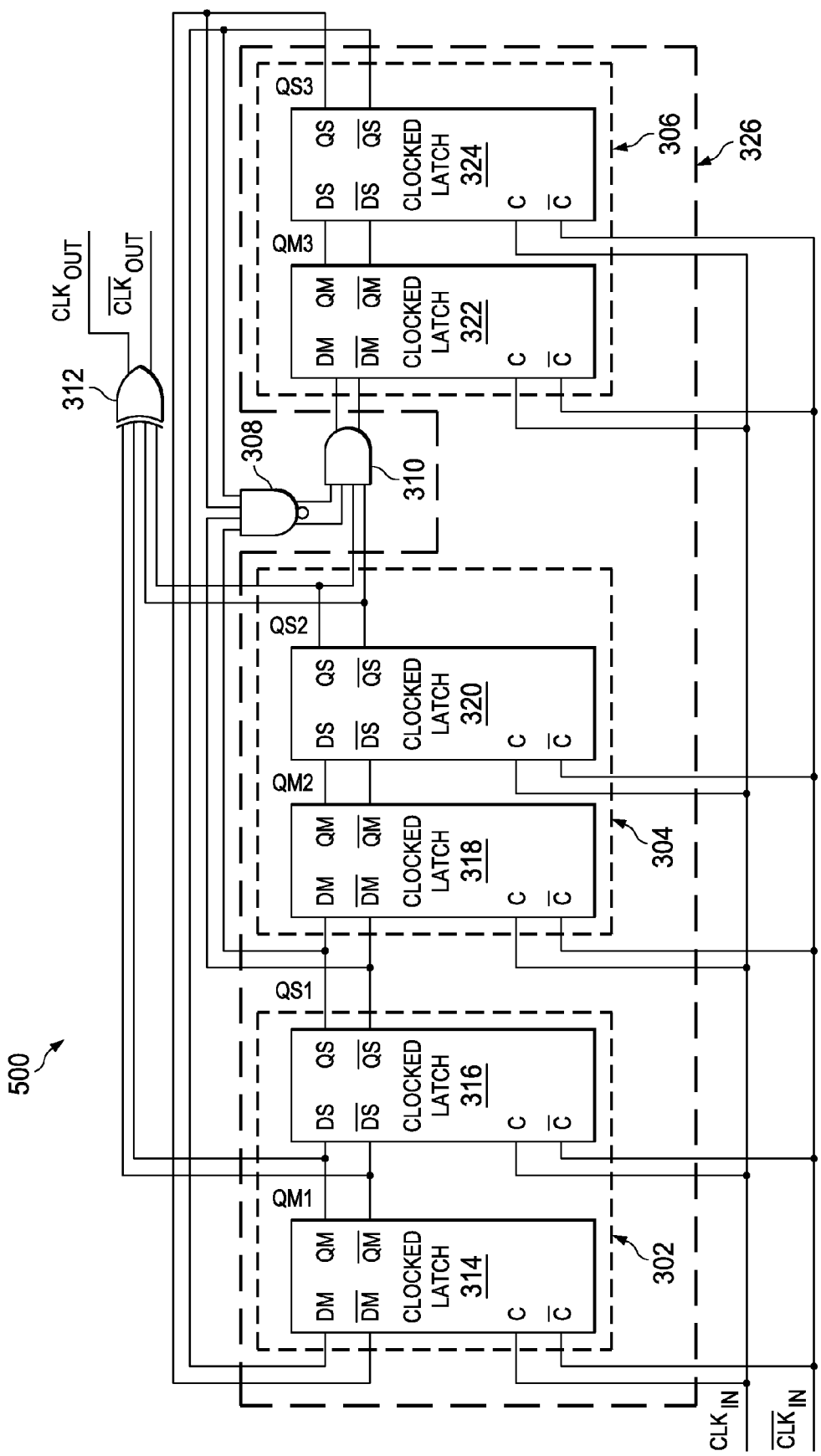
FIG. 5 is a third divide-by-three CML prescaler in accordance with a preferred embodiment of the present invention.

Moreover, as can be seen in FIGS. 3-5, there are an even number multiple (twelve) of N (three) desired states, including the internal states of flip-flops 302, 304, and 306. Accordingly, a possible cycle for the ring counter 326 would be:

In order to use these states to obtain a desired divided-by-three output, a third logic gate or CML XOR gate 312 can be employed. In particular, there are three configurations, which are depicted in FIGS. 3 through 5, that can yield an output frequency ($CLK_{out}$) that is exactly one-third the input frequency ($CLK_{in}$) with an approximately 50% duty cycle that is symmetrical with equal rise and fall times. Additionally, each of these different configurations, are at phases that are 120° apart from one another. Preferably, these configurations comprise the XOR 312 gating of one the following (as shown in prescalers 300, 400, and 500, respectively): output QM2 of master latch 318 and output QS3 of slave latch 324; output QS1 of slave latch 316 and output QM3 of master latch 322; and output QM1 of master latch 314 and output QS2 of slave latch 320. These outputs are shown in Table 1 below.

TABLE 1

| QM1 | QS1 | QM2 | QS2 | QM3 | QS3 | QM2 QS3 | QS1 QM3 | QM1 QS2 |
|-----|-----|-----|-----|-----|-----|---------|---------|---------|
| 0 | 0 | 0 | 0 | 0 | 0 | 0 | 0 | 0 |
| 1 | 0 | 0 | 0 | 0 | 0 | 0 | 0 | 1 |
| 1 | 1 | 0 | 0 | 0 | 0 | 0 | 1 | 1 |
| 1 | 1 | 1 | 0 | 0 | 0 | 1 | 1 | 1 |
| 1 | 1 | 1 | 1 | 0 | 0 | 1 | 1 | 0 |
| 1 | 1 | 1 | 1 | 1 | 0 | 1 | 0 | 0 |
| 1 | 1 | 1 | 1 | 1 | 1 | 0 | 0 | 0 |
| 0 | 1 | 1 | 1 | 1 | 1 | 0 | 0 | 1 |
| 0 | 0 | 1 | 1 | 1 | 1 | 0 | 1 | 1 |
| 0 | 0 | 0 | 1 | 1 | 1 | 1 | 1 | 1 |
| 0 | 0 | 0 | 0 | 1 | 1 | 1 | 1 | 0 |
| 0 | 0 | 0 | 0 | 0 | 1 | 1 | 0 | 0 |

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
   a ring counter having a plurality of master-slave flip-flops arranged in a series, wherein each master-slave flip-flop receives a clock signal, and wherein the ring counter has an even integer multiple of N states, and wherein the series includes a first sequence and a second sequence;
   correction logic having:
      a first logic gate that gates outputs from the last master-slave flip-flop of the second sequence and at least one master-slave flip-flop in the first sequence; and
      a second logic gate that gates outputs from the first logic gate and the last master-slave flip-flop of the first sequence, wherein the first master-slave flip-flop of the second sequence receives an output from the second logic gate; and
   an output logic gate that gates an internal state from at least one of the master-slave flip-flops with an output from one of the master-slave flip-flops to produce the clock signal divided by N.

2. The apparatus of claim 1, wherein the first logic gate is a NAND gate.

3. The apparatus of claim 1, wherein the second logic gate is an AND gate.

4. The apparatus of claim 1, wherein the output logic gate is a XOR gate.

5. An apparatus comprising:
   a plurality of master-slave flip-flops arranged in a first sequence and a second sequence, wherein the plurality of master-slave flip-flops has an even integer multiple of N states, and wherein each master-slave flip-flop has a plurality of clocked latches;
   correction logic interposed between the first and second sequences, wherein the correction logic includes:
      a first logic gate that gates outputs from the last master-slave flip-flop of the second sequence and at least one master-slave flip-flop in the first sequence; and
      a second logic gate that gates outputs from the first logic gate and the last master-slave flip-flop of the first sequence, wherein the first master-slave flip-flop of the second sequence receives an output from the second logic gate; and
   an output logic gate that gates an output from internal clocked latch from at least one of the master-slave flip-flops with an output from one of the master-slave flip-flops to produce the clock signal divided by N.

6. The apparatus of claim 5, wherein each master-slave flip-flop further includes:
   a first clocked latch that receives a clock signal at its clock input and a clockbar signal at its clockbar input; and
   a second clocked latch that receives the output of the first clocked latch, the clockbar signal at its clock input, and the clock signal at its clockbar input.

7. The apparatus of claim 6, wherein the outputs of two clocked latches from the first sequence are gated by the output logic gate.

8. The apparatus of claim 6, wherein the outputs of two flip-flops from the first sequence are gated by the output logic gate.

9. The apparatus of claim 6, wherein the outputs of one of the clocked latches from the first sequence and one of the clocked latches from the second sequence are gated by the output logic gate.

10. The apparatus of claim 5, wherein the first logic gate is a NAND gate.

11. The apparatus of claim 5, wherein the second logic gate is an AND gate.

12. The apparatus of claim 5, wherein the output logic gate is a XOR gate.

13. An apparatus comprising:
a ring counter having 12 states and that receives a clock signal, wherein the ring counter includes:
   a first set of master-slave flip-flops arranged in a first sequence; and
   a second set of master-slave flip-flops arranged in a second sequence;
a NAND gate that gates the outputs of the second set of master-slave flip-flops and at least one master-slave flip-flop from the first set of master-slave flip-flops;
an AND gate that gates the outputs of the last master-slave flip-flop from the first sequence and the NAND gate, wherein the first master-slave flip-flop from the second sequence receives an output from the AND gate; and
an XOR gate that gates the outputs from at least two clocked latches from the ring counter to output the clock signal divided by 3.

14. The apparatus of claim 13, wherein the outputs of two clocked latches from the first sequence are gated by the XOR gate.

15. The apparatus of claim 13, wherein the outputs of two flip-flops from the first sequence are gated by the XOR gate.

16. The apparatus of claim 13, wherein the outputs of one of the clocked latches from the first sequence and one of the clocked latches from the second sequence are gated by the XOR gate.

* * * * *